US009093327B2

(12) United States Patent
Koresawa et al.

(10) Patent No.: US 9,093,327 B2
(45) Date of Patent: Jul. 28, 2015

(54) DISPLAY PANEL DEVICE AND METHOD OF MANUFACTURING DISPLAY PANEL DEVICE

(71) Applicant: PANASONIC CORPORATION, Osaka (JP)

(72) Inventors: Kouhei Koresawa, Kyoto (JP); Yuko Okumoto, Osaka (JP); Kenichi Sasai, Osaka (JP); Takaaki Ukeda, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 40 days.

(21) Appl. No.: 14/147,635

(22) Filed: Jan. 6, 2014

(65) Prior Publication Data

US 2014/0117363 A1     May 1, 2014

Related U.S. Application Data

(63) Continuation of application No. PCT/JP2011/004380, filed on Aug. 3, 2011.

(51) Int. Cl.
*H01L 31/00*   (2006.01)
*H01L 21/00*   (2006.01)
(Continued)

(52) U.S. Cl.
CPC .......... *H01L 27/124* (2013.01); *H01L 27/1259* (2013.01); *H01L 27/3274* (2013.01); *H01L 29/7869* (2013.01); *H01L 27/1225* (2013.01); *H01L 27/3262* (2013.01)

(58) Field of Classification Search
CPC ......................... H01L 29/7869; H01L 27/3262
USPC ............................................. 257/59; 438/158
See application file for complete search history.

(56) References Cited

U.S. PATENT DOCUMENTS 7,858,971 B2   12/2010   Song et al.
7,989,955 B2 *  8/2011   Yagi .............................. 257/758
(Continued)

FOREIGN PATENT DOCUMENTS

JP      61-289648        12/1986
JP      10-335669        12/1998
(Continued)

OTHER PUBLICATIONS

International Search Report (ISR) in International Application No. PCT/JP2011/004380, dated Oct. 25, 2011.
(Continued)

*Primary Examiner* — Mohammad Islam
*Assistant Examiner* — Chi-Hua Yang
(74) *Attorney, Agent, or Firm* — Greenblum & Bernstein, P.L.C.

(57) ABSTRACT

A display panel device includes: a gate electrode above a substrate; a gate insulator above the gate electrode; a first source electrode and a first drain electrode above the gate insulator; a second source electrode and a second drain electrode above the first source electrode and the first drain electrode respectively; a first partition wall part having an opening in which the second source electrode and the second drain electrode are exposed; a semiconductor layer in the opening; an insulation layer above the semiconductor layer; a lower electrode above the insulation layer; and a contact hole in the insulation layer, for connecting the lower electrode and the second drain electrode or the second source electrode, wherein a film structure of each of the second source electrode and the second drain electrode is sparser than a film structure of each of the first source electrode and the first drain electrode.

10 Claims, 10 Drawing Sheets

(51) Int. Cl.
    *H01L 21/84*     (2006.01)
    *H01L 27/12*     (2006.01)
    *H01L 29/786*     (2006.01)
    *H01L 27/32*     (2006.01)

(56) References Cited

U.S. PATENT DOCUMENTS

| | | |
|---|---|---|
| 7,998,787 B2 * | 8/2011 | Seo et al. ............ 438/99 |
| 8,426,870 B2 | 4/2013 | Kanegae et al. |
| 8,487,395 B2 | 7/2013 | Kanegae et al. |
| 8,492,754 B2 | 7/2013 | Nishiyama et al. |
| 8,524,328 B2 | 9/2013 | Takeuchi |
| 2002/0013021 A1 * | 1/2002 | Jeong et al. ............ 438/149 |
| 2004/0012017 A1 * | 1/2004 | Nagayama ............ 257/40 |
| 2005/0057136 A1 * | 3/2005 | Moriya et al. ............ 313/311 |
| 2006/0267005 A1 * | 11/2006 | Kawase et al. ............ 257/40 |
| 2007/0087487 A1 * | 4/2007 | Honda ............ 438/149 |
| 2008/0012024 A1 | 1/2008 | Song et al. |
| 2008/0265442 A1 * | 10/2008 | Yagi ............ 257/786 |
| 2012/0175603 A1 | 7/2012 | Takeuchi |

FOREIGN PATENT DOCUMENTS

| | | |
|---|---|---|
| JP | 2002-305308 | 10/2002 |
| JP | 2008-022008 | 1/2008 |
| JP | 2008-258252 | 10/2008 |
| JP | 2008-277371 | 11/2008 |

OTHER PUBLICATIONS

US 6,133,584, 10/2000, Sakata et al. (withdrawn)

* cited by examiner

Thornton zone model

DISPLAY PANEL DEVICE AND METHOD OF MANUFACTURING DISPLAY PANEL DEVICE

CROSS REFERENCE TO RELATED APPLICATION

This is a continuation application of PCT Patent Application No. PCT/JP2011/004380 filed on Aug. 3, 2011, designating the United States of America. The entire disclosure of the above-identified application, including the specification, drawings and claims are incorporated herein by reference in its entirety.

FIELD

One or more exemplary embodiments disclosed herein relate generally to a display panel device and a method of manufacturing the display panel device, and in particular to a display panel device including a thin film transistor in which a semiconductor layer is formed inside a partition wall and a method of manufacturing the display panel device.

BACKGROUND

Thin film transistors called "TFT" are used in active matrix display devices such as liquid crystal display devices and organic electroluminescence (EL) display devices.

Thin film transistors having semiconductor layers made of silicon are typically used in commercially available display devices. In recent years, however, attention has been given to thin film transistors whose semiconductor layers can be formed by a liquid phase process. Organic thin film transistors having semiconductor layers made of an organic material and the like have particularly attracted attention. These thin film transistors whose semiconductor layers can be formed by a liquid phase process allow a flexible material with a low process temperature (e.g. a resin such as plastic) to be used as a substrate.

Thus, the use of thin film transistors (especially, organic thin film transistors) whose semiconductor layers can be formed by a liquid phase process enables production of a lighter, thinner, and more flexible electronic device than an electronic device including silicon thin film transistors. Proposals of using organic thin film transistors in next-generation display devices, electronic paper, and the like have been made accordingly.

For example, Patent Literature (PTL) 1 discloses a bottom-gate organic thin film transistor. The conventional organic thin film transistor includes: a gate electrode; a gate insulator; a pair of a source electrode and a drain electrode (source/drain electrode); a partition wall part having an opening above the gate electrode; and an organic semiconductor layer formed in the opening of the partition wall part by inkjet.

The organic thin film transistor having such a structure is used, for example, as a driver transistor or a switching transistor provided for each pixel in a TFT array substrate in which a plurality of pixels are arranged in a matrix. In the organic thin film transistor of each pixel, the source/drain electrode is extended to also function as wiring.

CITATION LIST

Patent Literature

[PTL 1]
Japanese Unexamined Patent Application Publication No. 2008-22008

SUMMARY

Technical Problem

Larger screen sizes of display panel devices in recent years lead to longer wiring in the pixel circuit part. This causes an increase in wiring resistance, thus creating a problem of lower display image quality. In particular, given that the source/drain electrode in the thin film transistor is partly extended to also function as wiring, not only performance as a thin film transistor but also performance as wiring is required of the material and structure of the source/drain electrode.

In the case where the semiconductor layer formed by the liquid phase process is used as a channel layer, the partition wall part is formed to define the semiconductor layer. Here, the residue of the partition wall part may remain on the surface of the source/drain electrode. The presence of the residue on the source/drain electrode degrades the crystallinity of the semiconductor layer in the part contacting the source/drain electrode, thus creating a problem of lower TFT characteristics.

In the display panel device, an insulation layer is further formed to cover the thin film transistor in order to planarize the drive circuit part, and a pixel electrode of a display element is formed on the insulation layer. The source/drain electrode and the pixel electrode are connected through a contact hole formed in the insulation layer. When burning the insulation layer, however, the surface of the source/drain electrode in the contact hole is exposed to a high temperature atmosphere, which causes an oxide film to be formed on the surface of the source/drain electrode. As a result, the contact resistance between the source/drain electrode and the pixel electrode increases and also varies, thus creating a problem of lower yields.

One non-limiting and exemplary embodiment provides a display panel device in which low-resistance wiring can be formed and which includes a thin film transistor having a source/drain electrode that can achieve favorable contact with a pixel electrode and contribute to excellent TFT characteristics, and a method of manufacturing the display panel device.

Solution to Problem

As one general aspect of a display panel device, the techniques disclosed here feature a display panel device including: a substrate; a gate electrode above the substrate; a gate insulator above the gate electrode; a first source electrode above the gate insulator; a second source electrode above the first source electrode; a first drain electrode above the gate insulator; a second drain electrode above the first drain electrode; a partition wall part having an opening in which at least a part of the second source electrode and a part of the second drain electrode are exposed; a semiconductor layer in the opening, the semiconductor layer contacting at least the second source electrode and the second drain electrode; an insulation layer above the semiconductor layer; a pixel electrode above the insulation layer; and a contact hole in the insulation layer, for connecting the pixel electrode and the second drain electrode or the second source electrode, wherein a film structure of the second source electrode is sparser than a film structure of the first source electrode, and a film structure of the second drain electrode is sparser than a film structure of the first drain electrode.

Advantageous Effects

In a display panel device according to one or more exemplary embodiments or features disclosed herein, low-resistance wiring can be formed, and a thin film transistor having a source/drain electrode that can achieve favorable contact with a pixel electrode and contribute to excellent TFT characteristics can be realized.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT(S)

Figure 1:
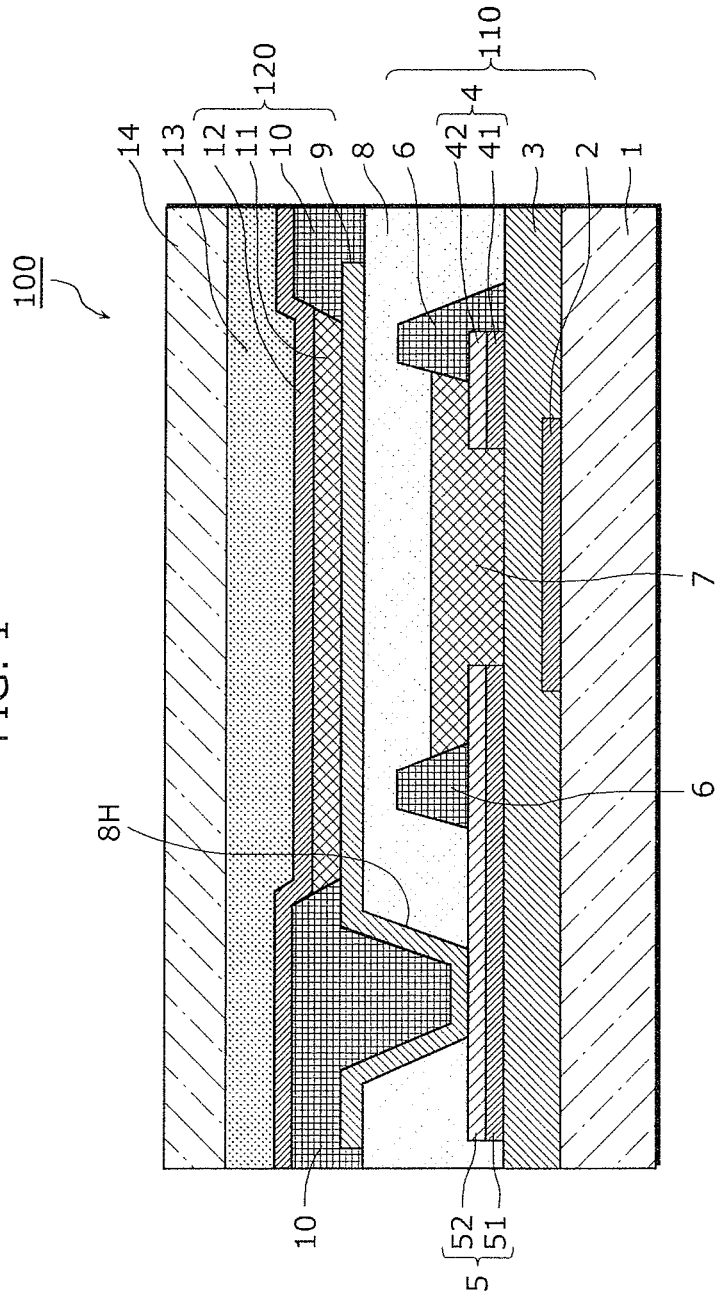
FIG. 1 is a section view showing a structure of one pixel of a display panel device according to an exemplary embodiment.

According to an exemplary embodiment disclosed herein, a display panel device includes: a substrate; a gate electrode above the substrate; a gate insulator above the gate electrode; a first source electrode above the gate insulator; a second source electrode above the first source electrode; a first drain electrode above the gate insulator; a second drain electrode above the first drain electrode; a partition wall part having an opening in which at least a part of the second source electrode and a part of the second drain electrode are exposed; a semiconductor layer in the opening, the semiconductor layer contacting at least the second source electrode and the second drain electrode; an insulation layer above the semiconductor layer; a pixel electrode above the insulation layer; and a contact hole in the insulation layer, for connecting the pixel electrode and the second drain electrode or the second source electrode, wherein a film structure of the second source electrode is sparser than a film structure of the first source electrode, and a film structure of the second drain electrode is sparser than a film structure of the first drain electrode.

With this, the film structure of the second source electrode and the second drain electrode in the upper layer is sparser (i.e. less dense) than the film structure of the first source electrode and the first drain electrode in the lower layer. In other words, the source electrode and the drain electrode each have the stack structure of the upper layer (the second source electrode, the second drain electrode) which is a low density film and the lower layer (the first source electrode, the first drain electrode) which is a high density film. This reduces the wiring resistance of the source electrode and the drain electrode, with it being possible to improve the display image quality.

Moreover, since the upper layer of the source electrode and the drain electrode is the low density film which is easily soluble, a surface oxide film generated on the low density film can be removed easily, and the residue of the partition wall layer remaining on the surface of the low density film can be removed together with the surface oxide film. This contributes to favorable crystallinity of the semiconductor layer in contact with the low density film. In addition, since the low density film is easily oxidizable, an oxide film can be easily formed at the interface between the semiconductor layer and the low density film, which improves the charge injection characteristics between the source electrode or the drain electrode and the semiconductor layer. It is therefore possible to realize a thin film transistor with excellent turn-on characteristics.

Furthermore, since the surface oxide film of the second drain electrode which is the low density film is easily removable, the surface oxide film of the second drain electrode in the contact hole can be removed easily. This reduces the contact resistance between the second drain electrode and the pixel electrode, with it being possible to achieve favorable contact between the drain electrode and the pixel electrode.

For example, sheet resistances of the first source electrode and the first drain electrode may be lower than sheet resistances of the second source electrode and the second drain electrode. In this case, for example, the sheet resistances of the first source electrode and the first drain electrode may be $0.5\Omega/\square$ to $5\Omega/\square$, and the sheet resistances of the second source electrode and the second drain electrode may be $80\Omega/\square$ to $140\Omega/\square$.

With this, the first source electrode and the first drain electrode can be made as the desired high density film, and the second source electrode and the second drain electrode can be made as the desired low density film.

For example, the second drain electrode may have a film thickness that is smaller in a part contacting the semiconductor layer than in a part not contacting the semiconductor layer, and have a depression in a part corresponding to the contact hole.

With this, the surface oxide film of the second drain electrode is removed, so that there is no residue of the partition wall layer in the semiconductor layer formation area and also favorable contact is achieved in the contact area with the pixel electrode.

For example, a film thickness of each one of the second source electrode and the second drain electrode may be greater than or equal to 20 nm.

With this, the first source electrode and the first drain electrode in the lower layer are kept from being removed even when the surface oxide film of the second source electrode and the second drain electrode in the upper layer is removed.

According to an exemplary embodiment disclosed herein, a method of manufacturing a display panel device includes:

forming a gate electrode above a substrate; forming a gate insulator above the gate electrode; forming a first metal film above the gate insulator; forming a second metal film above the first metal film, the second metal film having a film structure that is sparser than a film structure of the first metal film; forming each of a source electrode and a drain electrode by patterning the first metal film and the second metal film; forming a partition wall layer above the source electrode and the drain electrode; forming a partition wall by patterning the partition wall layer to form an opening in which the gate insulator between the source electrode and the drain electrode, a part of the source electrode, and a part of the drain electrode are exposed; forming a semiconductor layer in the opening, over upper surfaces of the source electrode and the drain electrode and an upper surface of the gate insulator; forming an insulation layer above the semiconductor layer; forming a contact hole in the insulation layer above the drain electrode on an opposite side of the partition wall to the semiconductor layer, to expose the drain electrode; and forming a pixel electrode above the insulation layer and above the drain electrode exposed in the contact hole.

In this way, it is possible to form the source electrode and the drain electrode each having the stack structure of the upper layer and the lower layer, where the upper layer is a low density film which is the second metal film and the lower layer is a high density film which is the first metal film. This reduces the wiring resistance of the source electrode and the drain electrode.

Moreover, since the upper layer of the source electrode and the drain electrode is the low density film which is easily soluble, a surface oxide film generated on the low density film can be removed easily and the residue of the partition wall layer remaining on the surface of the low density film can be removed together with the surface oxide film in the step of forming the partition wall. This contributes to favorable crystallinity of the semiconductor layer in contact with the low density film. It is therefore possible to realize a thin film transistor with excellent turn-on characteristics.

For example, the forming of a partition wall may include, when forming the opening in the partition wall layer, removing a part of an upper layer of the second metal film and simultaneously removing a residue of the partition wall layer on the second metal film.

In this way, the surface oxide film generated on the second metal film which is the low density film and the residue of the partition wall layer remaining on the surface of the second metal film can be removed simultaneously.

For example, the method of manufacturing a display panel device may include removing a surface oxide film formed on the drain electrode exposed in the contact hole, between the forming of a contact hole and the forming of a pixel electrode.

In this way, since the second metal film as the surface layer of the drain electrode is the low density film, the surface oxide film of the second metal film can be removed easily. This reduces the contact resistance between the second drain electrode and the pixel electrode.

For example, the removing may include forming a depression in the second metal film in the drain electrode exposed in the contact hole.

In this way, the depression is formed by removing the surface oxide film of the second metal film. The drain electrode and the pixel electrode can thus contact each other through the depression with no surface oxide film.

Embodiment

The following describes a display panel device and a method of manufacturing the display panel device according to an exemplary embodiment. Note that the present disclosure is defined based on the claims. Accordingly, the structural elements that are included in the exemplary embodiment but are not defined in the claims are described as not being necessarily required for achieving the object of the present disclosure but constituting more preferred embodiments. Each drawing is a schematic and does not necessarily provide precise depiction.

A display panel device according to this embodiment is an organic EL display device having a pixel part (display part) in which a plurality of pixels are arranged in a matrix, and includes: an EL layer including an organic EL element corresponding to each pixel; and a TFT layer including a pixel circuit part composed of thin film transistors, lines, and the like. The pixel circuit part includes a driver transistor for pixel driving and a switching transistor for pixel selection corresponding to each pixel, a source line, a gate line, a power line, and other various lines.

A structure of one pixel (subpixel) of a display panel device 100 according to this embodiment is described first, with reference to FIG. 1. FIG. 1 is a section view showing the structure of one pixel of the display panel device according to this embodiment.

As shown in FIG. 1, the display panel device 100 includes: a substrate 1; a thin film transistor 110 formed above the substrate 1 and including a gate electrode 2, a gate insulator 3, a source electrode 4, a drain electrode 5, a first partition wall part 6, and a semiconductor layer 7; an insulation layer 8 formed to cover the thin film transistor 110; an organic EL element 120 formed above the insulation layer 8 and including a lower electrode 9, a second partition wall part 10, an organic layer 11, and an upper electrode 12; a sealing layer 13 formed to cover the organic EL element 120; and a sealing substrate 14.

The thin film transistor 110 is formed by applying the semiconductor layer 7, which serves as a channel layer, into the opening of the first partition wall part 6. Specifically, the thin film transistor 110 in this embodiment is an organic thin film transistor in which the semiconductor layer 7 is made of an organic material. The thin film transistor 110 is also a bottom-gate thin film transistor. A plurality of thin film transistors 110 are formed in an array, above the substrate 1. The thin film transistor 110 shown in FIG. 1 is a p-channel driver transistor, with the drain electrode 5 being electrically connected to the lower electrode 9 of the organic EL element 120. Note that no switching transistor is shown in FIG. 1. The following describes each structural element of the thin film transistor 110 in detail.

The substrate 1 is, for example, a glass substrate made of silica glass or non-alkali glass. The substrate 1 may be a flexible substrate having flexibility such as a plastic film.

The gate electrode 2 is patterned in a predetermined shape above the substrate 1. The gate electrode 2 has a single-layer structure or a multilayer structure of a conductive material, an alloy of the conductive material, or the like. For example, the gate electrode 2 is formed using molybdenum (Mo), aluminum (Al), copper (Cu), tungsten (W), titanium (Ti), chromium (Cr), molybdenum tungsten (MoW), or the like.

The gate insulator 3 (gate insulation layer) is formed above the gate electrode 2. In this embodiment, the gate insulator 3 is formed over the entire substrate 1 to cover the gate electrode 2. The gate insulator 3 may be an inorganic insulator of a single-layer film or a stacked-layer film such as a silicon oxide film or a silicon nitride film. Alternatively, the gate insulator 3 may be an organic insulator such as polyimide, polyvinyl phenol, or polypropylene.

The pair of the source electrode 4 and the drain electrode 5 are formed above the gate insulator 3, to face each other with a predetermined space therebetween above the gate electrode 2. The source electrode 4 and the drain electrode 5 can be made of a conductive material, an alloy of the conductive material, or the like. For example, the source electrode 4 and the drain electrode 5 can be formed using Mo, W, MoW, or the like.

The source electrode 4 is composed of a plurality of layers. In this embodiment, the source electrode 4 is composed of two layers: a first source electrode 41 formed on the surface of the gate insulator 3; and a second source electrode 42 formed on the first source electrode 41. The first source electrode 41 and the second source electrode 42 have film properties of different densities. The first source electrode 41 in the lower layer is a high density film, whereas the second source electrode 42 in the upper layer is a low density film. That is, the film structure of the second source electrode 42 in the upper layer is sparser than the film structure of the first source electrode 41 in the lower layer. In other words, the film structure of the first source electrode 41 in the lower layer is denser than the film structure of the second source electrode 42 in the upper layer. Due to such film structures, the sheet resistance of the first source electrode 41 is lower than the sheet resistance of the second source electrode 42. In detail, the sheet resistance of the first source electrode 41 is 0.5 to 5[Ω/□], and the sheet resistance of the second source electrode 42 is 80 to 140[Ω/□]. In this embodiment, the film thickness of the second source electrode 42 which is the low density film is smaller than the film thickness of the first source electrode 41 which is the high density film. As an example, the film thickness of the second source electrode 42 is 20 nm to 50 nm, and the film thickness of the first source electrode 41 is 50 nm to 800 nm.

The drain electrode 5 is composed of a plurality of layers, as with the source electrode 4. In this embodiment, the drain electrode 5 is composed of two layers: a first drain electrode 51 formed on the surface of the gate insulator 3; and a second drain electrode 52 formed on the first drain electrode 51. In the drain electrode 5, too, the first drain electrode 51 and the second drain electrode 52 have film properties of different densities. The first drain electrode 51 in the lower layer is a high density film, whereas the second drain electrode 52 in the upper layer is a low density film. That is, the film structure of the second drain electrode 52 in the upper layer is sparser than the film structure of the first drain electrode 51 in the lower layer. In other words, the film structure of the first drain electrode 51 in the lower layer is denser than the film structure of the second drain electrode 52 in the upper layer. Due to such film structures, the sheet resistance of the first drain electrode 51 in the lower layer is lower than the sheet resistance of the second drain electrode 52 in the upper layer, as with the source electrode 4. In detail, the sheet resistance of the first drain electrode 51 is 0.5 to 5[Ω/□], and the sheet resistance of the second drain electrode 52 is 80 to 140[Ω/□]. In this embodiment, the film thickness of the second drain electrode 52 which is the low density film is smaller than the film thickness of the first drain electrode 51 which is the high density film. As an example, the film thickness of the second drain electrode 52 is 20 nm to 50 nm, and the film thickness of the first drain electrode 51 is 50 nm to 800 nm.

In this embodiment, the pair of the source electrode 4 and the drain electrode 5 are formed in the same layers of the upper layer (the second source electrode 42, the second drain electrode 52) and the lower layer (the first source electrode 41, the first drain electrode 51). Hence, the first source electrode 41 and the first drain electrode 51 located in the lower layer have the same material and the same film thickness, and the second source electrode 42 and the second drain electrode 52 located in the upper layer have the same material and the same film thickness. Moreover, the first source electrode 41 and the first drain electrode 51 have the same sheet resistance, and the second source electrode 42 and the second drain electrode 52 have the same sheet resistance. In this embodiment, the first source electrode 41, the second source electrode 42, the first drain electrode 51, and the second drain electrode 52 are all formed using Mo.

As shown in FIG. 1, the drain electrode 5 in this embodiment is extended in the part opposite to the semiconductor layer 7. The extended part of the drain electrode 5 functions as a line (wiring layer) for connection to another conductive part. In this embodiment, the extended part of the drain electrode 5 functions as a connection line to the lower electrode 9 of the organic EL element 120. In detail, the part of the drain electrode 5 on the opposite side of the partition wall of the first partition wall part 6 formed on the drain electrode 5 to the part in contact with the semiconductor layer 7 serves as the line. That is, the drain electrode 5 is connected to the semiconductor layer 7 on one side of the partition wall of the first partition wall part 6, and connected to the lower electrode 9 on the other side of the partition wall of the first partition wall part 6.

The first partition wall part 6 is a TFT bank layer included in the TFT layer, and is formed above the source electrode 4 and the drain electrode 5. The first partition wall part 6 has an opening for separating the semiconductor layer 7 on a pixel basis, and a partition wall (bank) for defining the periphery of the semiconductor layer 7. The partition wall of the first partition wall part 6 has a function of defining the applied semiconductor layer 7. For example, when a solvent for forming the semiconductor layer 7 is applied, the partition wall of the first partition wall part 6 blocks flow of the solvent. The opening of the first partition wall part 6 exposes a part of the source electrode 4, a part of the drain electrode 5, and a part of the gate insulator 3. In detail, the opening of the first partition wall part 6 is formed to expose a part of the upper surface of the second source electrode 42 on the semiconductor layer 7 side, the side surface of the first source electrode 41, the surface of the gate insulator 3 above the gate electrode 2, the side surface of the first drain electrode 51, and a part of the upper surface of the second drain electrode 52 on the semiconductor layer 7 side.

The partition wall of the first partition wall part 6 can be formed using a photosensitive resin such as a resist, and the opening of the first partition wall part 6 can be formed by partly exposing and developing the photosensitive resin. It is preferable to perform a predetermined surface treatment on the first partition wall part 6, to provide water repellency to the surface of the first partition wall part 6.

The semiconductor layer 7 is formed in the opening of the first partition wall part 6 so as to be in contact with at least the source electrode 4 and the drain electrode 5. The semiconductor layer 7 functions as the channel layer of the thin film transistor, and is formed above the gate electrode 2. In this embodiment, the semiconductor layer 7 is formed above the gate insulator 3 between the source electrode 4 and the drain electrode 5, above the source electrode 4, and above the drain electrode 5. Thus, the semiconductor layer 7 is formed over the upper surface of the second source electrode 42 of the source electrode 4 and the upper surface of the second drain electrode 52 of the drain electrode 5.

The semiconductor layer 7 is a coating semiconductor layer, and can be formed by applying a predetermined material such as a solvent into the opening of the first partition wall part 6 by a printing method such as inkjet and crystallizing the material. Examples of the coating semiconductor layer 7 include an organic semiconductor layer using a soluble organic material such as pentacene, phthalocyanine, or porphyrin, and an oxide semiconductor layer using a transparent amorphous oxide semiconductor such as IGZO (InGaZnO$_x$). In this embodiment, an organic material is used as the semiconductor layer 7.

Though not shown, a protection film may be formed in the opening of the first partition wall part 6 to cover the semiconductor layer 7, in order to protect the semiconductor layer 7. An organic material of a high polymer material such as an acrylic polymer or a low polymer material such as an acrylic monomer can be used as the protection film. The protection film can prevent water, oxygen, and the like from entering the semiconductor layer 7.

The insulation layer 8 is formed above the semiconductor layer 7. In this embodiment, the insulation layer 8 is a planarizing insulation layer formed over the entire substrate 1 to cover the plurality of thin film transistors 110. That is, the insulation layer 8 is an interlayer insulation film for suppressing a leak current between the layers, and also a thick planarizing film for planarizing the surface of the thin film transistor 110. For example, the insulation layer 8 can be formed using an organic material such as a resist or an inorganic material such as SOG (Spin On Glass).

The insulation layer 8 has a contact hole 8H for connecting the lower electrode 9 of the organic EL element 120 and the drain electrode 5 (the extended part of the drain electrode 5). The contact hole 8H is formed by removing the insulation layer 8 on the drain electrode 5. The contact hole 8H exposes the surface of the drain electrode 5, i.e. the surface of the second drain electrode 52, so that the second drain electrode 52 and the lower electrode 9 can be connected through the contact hole 8H.

The following describes each structural element of the organic EL element 120 in detail. The organic EL element 120 in this embodiment is a top-emission organic EL element, and is formed above the insulation layer 8 on a pixel (light emitting unit) basis.

The lower electrode 9 is formed above the insulation layer 8, and functions as the pixel electrode of the organic EL element 120 which is the anode into which a current flows from the drive circuit part. Since the organic EL element 120 in this embodiment is the top emission type, the lower electrode 9 is a reflective electrode. For example, the lower electrode 9 as a reflective electrode has a single-layer structure of a reflective metal such as Al or silver alloy APC, or a two-layer structure of a transparent metal oxide such as ITO (Indium Tin Oxide) and a reflective metal such as silver alloy APC. The lower electrode 9 is formed separately on a pixel basis. In the case of a bottom-emission organic EL element, on the other hand, the lower electrode 9 is a transparent electrode made of only a transparent metal oxide such as ITO.

The lower electrode 9 is electrically connected to the drain electrode 5 of the thin film transistor 110 through the contact hole 8H that passes through the insulation layer 8, as mentioned above. In this embodiment, the lower electrode 9 is formed in contact with the second drain electrode 52 which is the low density layer exposed at the bottom of the contact hole 8H. Thus, the drain electrode 5 of the thin film transistor 110 as the driver transistor supplies a current corresponding to a data voltage supplied from the source line, to the lower electrode 9.

The organic layer 11 is formed above the lower electrode 9 on a pixel basis, and is an organic EL layer including a light emitting layer made of a predetermined organic light emitting material. The light emitting layer emits light when the light emitting material of the light emitting layer is excited by energy generated as a result of electrons injected by application of a predetermined voltage to the lower electrode 9 and the upper electrode 12 recombining with holes. For example, the light emitting layer has a stack structure of α-NPD (Bis [N-(1-naphthyl)-N-phenyl]benzidine) as a lower layer and Alq3 (tris-(8-hydroxyquinoline)aluminum) as an upper layer.

The organic layer 11 includes not only the light emitting layer but also a hole injection layer, a hole transport layer, an electron transport layer, or an electron injection layer. Part or all of these layers are stacked to constitute the organic layer 11. In this case, for example, a compound such as polyethylenedioxythiophene (PEDOT) is available as the hole injection layer, triphenylamine, polyanilline, or the like is available as the hole transport layer, and polyphenylene vinylene (PPV) or the like is available as the electron injection layer.

The upper electrode 12 is the cathode from which a current flows to the drive circuit part, and has a function of applying a negative voltage to the light emitting layer with respect to the lower electrode 9 to inject electrons to the light emitting layer. The upper electrode 12 is a transparent electrode situated facing the lower electrode 9, and is formed above the organic layer 11. In this embodiment, the upper electrode 12 is a common electrode common to each pixel. A material and structure with a high transmittance are preferably used for the upper electrode 12. For example, the upper electrode 12 can be made of a transparent metal oxide such as ITO or IZO (Indium Zinc Oxide). The potential of the upper electrode 12 is a ground potential in this embodiment.

The second partition wall part 10 is an EL bank layer included in the organic EL layer, and is formed above the insulation layer 8. The second partition wall part 10 has an opening for separating the organic layer 11 on a pixel basis, and a partition wall (bank) for defining the periphery of the organic layer 11. The partition wall of the second partition wall part 10 can be formed using a photosensitive resin such as a resist, and the opening of the second partition wall part 10 can be formed by partly exposing and developing the photosensitive resin.

The sealing layer 13 functions as a bonding layer for bonding the substrate 1 on which the structural elements up to the organic EL element 120 have been formed and the sealing substrate 14, and also functions as a protection layer for protecting the organic EL element 120 by sealing it. For example, an acrylic resin, an epoxy resin, or the like can be used as the material of the sealing layer 13. A thin film sealing layer may be additionally formed between the upper electrode 12 and the sealing layer 13, to protect the organic EL element 120 from water or oxygen. For example, a transparent insulation material such as silicon nitride (SiN) or silicon oxynitride (SiON) can be used as the material of the thin film sealing layer.

The sealing substrate 14 is a substrate for sealing the organic EL element 120 to protect the organic EL element 120 from outside. The sealing substrate 14 thus constitutes the outer surface of the display panel device 100. The sealing substrate 14 also transmits light emitted from the light emitting layer in the organic EL element 120. As a result of desired light emission from the organic EL elements 120 each of which corresponds to a different one of the plurality of pixels, a desired image is displayed on the sealing substrate 14. For example, a transparent glass substrate can be used as the sealing substrate 14. Color filters of the colors of red, green, and blue may be formed on the inner surface of the sealing substrate 14 according to need. In this case, the sealing substrate 14 transmits light that has passed through the color filters.

In the display panel device 100 having the structure described above, the source electrode 4 and the drain electrode 5 respectively have the first source electrode 41 and the first drain electrode 51 in the lower layer as the high density film, and the second source electrode 42 and the second drain electrode 52 in the upper layer as the low density film. That is, the film structure of the second source electrode 42 and the second drain electrode 52 is sparser than the film structure of the first source electrode 41 and the first drain electrode 51.

Figure 2A:
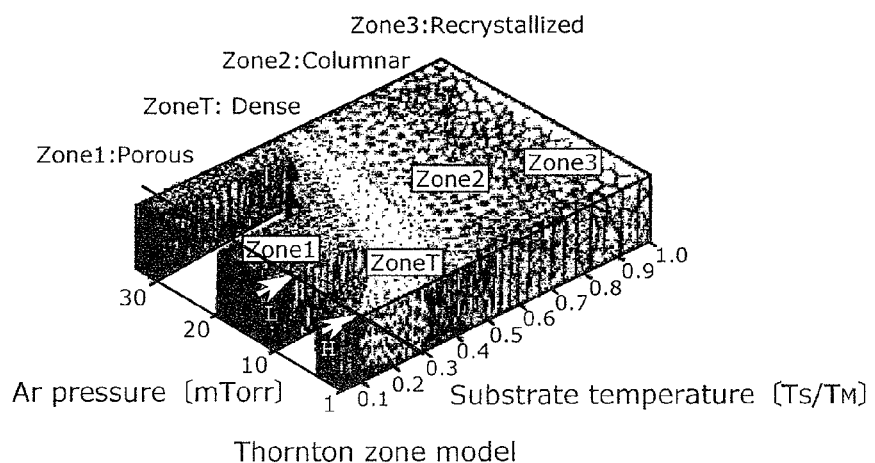
FIG. 2A is a diagram showing a Thornton model for modeling film structures formed by sputtering in various film formation conditions.
Figure 2B:
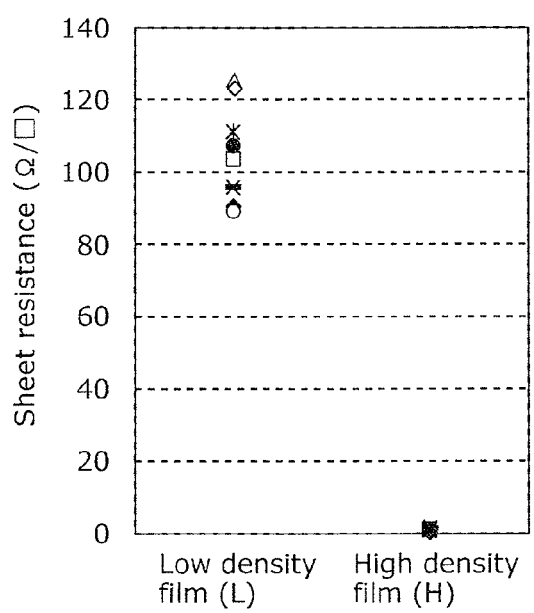
FIG. 2B is a diagram showing relationships between a low density film and a high density film in a Mo single layer and a sheet resistance.

The film structure of the source electrode 4 and the drain electrode 5 is described in detail below, with reference to FIGS. 2A and 2B. FIG. 2A is a diagram showing a Thornton model (reference: Hiroshi Ichimura, Masaru Ikenaga, "Basics and Application of Thin Films by a Plasma Process", the Nikkan Kogyo Shimbun, Ltd. (2005)) for modeling film structures formed by sputtering in various film formation conditions. FIG. 2B is a diagram showing the relationships between the low density film and the high density film in a Mo single layer and the sheet resistance.

As shown in FIG. 2A, the sputtered film structure can be classified into a region (Zone 1) of a porous film structure, a region (Zone T) of a dense film structure, a region (Zone 2) of a columnar grain film structure, and a region (Zone 3) of a recrystallized crystal grain film structure, according to the film formation condition of the Ar pressure (sputtering pressure) and the substrate temperature.

In this embodiment, the first source electrode 41 and the first drain electrode 51 in the lower layer respectively in the source electrode 4 and the drain electrode 5 are the high density film of the Mo single layer, and are formed under the condition indicated by arrow H in FIG. 2A. In this case, the first source electrode 41 and the first drain electrode 51 as the high density film have the film structure of Zone T, i.e. the dense film structure.

On the other hand, the second source electrode 42 and the second drain electrode 52 in the upper layer respectively in the source electrode 4 and the drain electrode 5 are the low density film of the Mo single layer, and are formed under the condition indicated by arrow L in FIG. 2A. In this case, the second source electrode 42 and the second drain electrode 52 as the low density film have the film structure of Zone 1, i.e. the porous film structure.

Thus, the film property of the second source electrode 42 and the second drain electrode 52 as the low density film is sparser than the film property of the first source electrode 41 and the first drain electrode 51 as the high density film. In other words, the low density film has the porous film structure, and is lower in proportion of Mo per unit volume than the high density film having the dense structure. In this embodiment, the film formation conditions (sputtering pressures) for the high density film and the low density film are 0.16 Pa and 1.0 Pa respectively, and the substrate temperatures for the high density film and the low density film are both 50° C.

A plurality of samples of the low density film (L) and the high density film (H) of the Mo single layer were formed under the film formation conditions in FIG. 2A, and the sheet resistance of each film was measured. FIG. 2B shows the measurement results. As shown in FIG. 2B, the sheet resistance of the low density film composed of the Mo single layer is in a range from 80Ω/□ to 130Ω/□, centered at about 100Ω/□. Meanwhile, the sheet resistance of the high density film composed of the Mo single layer is in a range to 2Ω/□. Thus, the sheet resistance of the high density film of the Mo single layer is lower than the sheet resistance of the low density film of the Mo single layer.

The first source electrode 41 and the first drain electrode 51 as the high density film can be made lower in resistance than the second source electrode 42 and the second drain electrode 52 as the low density film in this way. Accordingly, the resistance of the source electrode 4 and the drain electrode 5 can be reduced as compared with the case where the source electrode and the drain electrode are formed as a single layer of the low density film with the same film thickness. As a result, the resistance of the wiring part of the source electrode 4 and the drain electrode 5 can be reduced, too.

Figure 3:
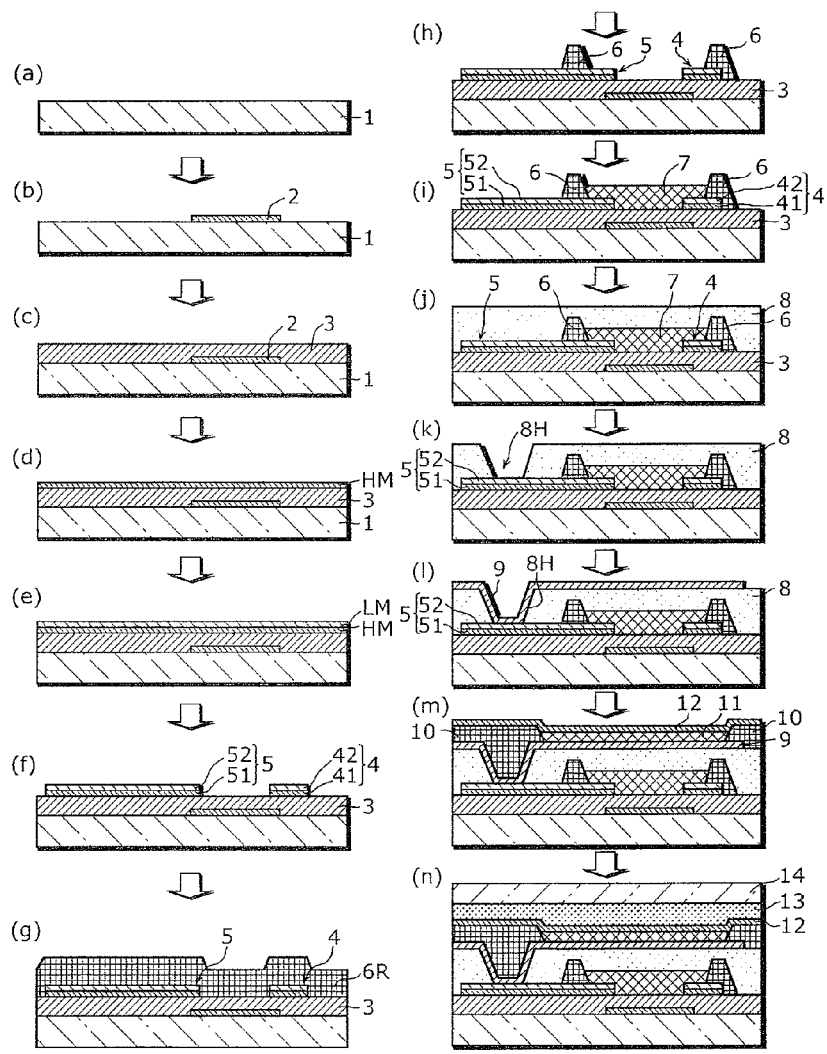
FIG. 3 is a section view for describing steps in a method of manufacturing the display panel device according to the exemplary embodiment.

The following describes a method of manufacturing the display panel device 100 according to this embodiment, with reference to FIG. 3. FIG. 3 is a section view for describing steps in a method of manufacturing the display panel device according to this embodiment.

First, as shown in (a) in FIG. 3, the substrate 1 is prepared. In this embodiment, a transparent glass substrate is prepared as the substrate 1. An undercoat layer may be formed on the substrate 1 according to need.

Next, as shown in (b) in FIG. 3, the gate electrode 2 of a predetermined shape is formed above the substrate 1. In detail, the material of the gate electrode 2 is deposited on the substrate 1 to form a gate metal film, and then the gate metal film is patterned by photolithography and etching to form the gate electrode 2 of the predetermined shape. The gate metal film can be formed by sputtering or evaporation. Wet etching or dry etching is available as the method of etching the gate metal film.

Next, as shown in (c) in FIG. 3, the gate insulator 3 is formed above the gate electrode 2. The gate insulator 3 is formed over the entire substrate 1. The gate insulator 3 can be formed by plasma CVD (Chemical Vapor Deposition) or coating, depending on the material. For example, in the case of using an inorganic insulator such as a silicon oxide film or a silicon nitride film as the gate insulator 3, the gate insulator 3 can be formed by plasma CVD. In the case of using an organic insulator such as polyimide, polyvinyl phenol, or polypropylene as the gate insulator 3, the gate insulator 3 can be formed by coating.

Next, as shown in (d) in FIG. 3, the material of the lower layer (the first source electrode 41 and the first drain electrode 51) of the source electrode 4 and the drain electrode 5 is deposited on the entire surface of the gate insulator 3 under a predetermined film formation condition, to form a high density metal film HM (first metal film) which is the high density film. In this embodiment, the high density metal film HM composed of the high density film of the Mo single layer is formed by sputtering. The film formation condition used here is the condition in Zone T shown in FIG. 2A. The high density metal film HM having the dense film structure can be formed in this way.

Next, as shown in (e) in FIG. 3, the material of the upper layer (the second source electrode 42 and the second drain electrode 52) of the source electrode 4 and the drain electrode 5 is deposited on the entire surface of the high density metal film HM under a predetermined film formation condition, to form a low density metal film LM (second metal film) which is the low density film. In this embodiment, the low density metal film LM composed of the low density film of the Mo single layer is formed by sputtering. The film formation condition used here is the condition in Zone 1 shown in FIG. 2A. The low density metal film LM having the porous structure, i.e. the film structure sparser than that of the high density metal film HM, can be formed in this way.

Note that the high density metal film HM and the low density metal film LM can be formed continuously without atmospheric exposure. In this case, the stacked-layer film of the high density metal film HM and the low density metal film LM can be formed by changing the film formation condition of sputtering from Zone T to Zone 1 during the formation process.

Next, as shown in (f) in FIG. 3, the stacked-layer film of the high density metal film HM and the low density metal film LM is patterned by photolithography and etching, to form the source electrode 4 and the drain electrode 5 of a predetermined shape. Through etching, the source electrode 4 having the stack structure of the first source electrode 41 as the lower layer and the second source electrode 42 as the upper layer and the drain electrode 5 having the stack structure of the first drain electrode 51 as the lower layer and the second drain electrode 52 as the upper layer can be patterned simultaneously.

As a result of etching, the gate insulator 3 is exposed in the areas where the high density metal film HM and the low density metal film LM have been removed. Wet etching or dry etching is available as the method of etching the stacked-layer film of the high density metal film HM and the low density metal film LM.

The line made by extending the source electrode 4 and the drain electrode 5 can be patterned at the same time as the source electrode 4 and the drain electrode 5. That is, the line made by the extension of the source electrode 4 and the drain electrode 5 can be formed together with the source electrode 4 and the drain electrode 5, using the same material. The low-resistance wiring composed of the stacked layer film of the high density film as the lower layer and the low density film as the upper layer can be formed in this way.

Next, as shown in (g) in FIG. 3, the material of the first partition wall part 6 is applied over the entire substrate 1, to form a partition wall layer 6R. Thus, the partition wall layer 6R is formed above the exposed gate insulator 3 and above the source electrode 4 and the drain electrode 5. In this embodiment, the partition wall layer 6R is formed using a photosensitive resin.

Next, as shown in (h) in FIG. 3, the partition wall layer 6R is patterned to form the opening so as to re-expose the gate insulator 3 between the source electrode 4 and the drain electrode 5 and a part of each of the source electrode 4 and the drain electrode 5, thereby forming the first partition wall part 6 of a predetermined shape. As a result, the partition wall of the predetermined shape is formed above the source electrode 4 and the drain electrode 5.

Here, the opening of the first partition wall part 6 is formed to expose both of the upper surfaces of the facing ends of the source electrode 4 and the drain electrode 5. The partition wall (bank) which is the inner wall of the opening of the first partition wall part 6 is shaped like a frame to surround the periphery of the gate electrode 2 above the gate electrode 2. In addition, the partition wall layer 6R above the drain electrode 5 in the contact part between the drain electrode 5 and the lower electrode 9 is removed to expose the second drain electrode 52 of the drain electrode 5. Here, the partition wall layer 6R can be patterned by exposing and developing the partition wall layer 6R.

Next, a solution including a semiconductor material (semiconductor solution) is applied into the opening of the first partition wall part 6 by inkjet. The solution including the semiconductor material spreads over not only the exposed upper surface of the gate insulator 3 but also the upper surfaces of the facing ends of the source electrode 4 and the drain electrode 5. As a result, the solution including the semiconductor material is applied with a substantially uniform film thickness on the upper surface of the gate insulator 3 and the upper surfaces of the source electrode 4 and the drain electrode 5. The semiconductor solution spreading in the opening is guarded by the partition wall (the inner wall of the opening) of the first partition wall part 6, thus defining the semiconductor solution application area. This prevents the semiconductor solution from flowing out of the opening of the first partition wall part 6. The method of applying the solution including the semiconductor material (semiconductor solution) is not limited to inkjet, and may be a well-known solution process.

After this, a predetermined heat treatment is performed to dry the solution including the semiconductor material, thereby crystallizing the semiconductor material. As a result, the semiconductor layer 7 of the predetermined shape with the defined outer periphery is formed in the opening of the first partition wall part 6, as shown in (i) in FIG. 3. The semiconductor layer 7 can be formed over the upper surfaces of the source electrode 4 and the drain electrode 5 and the upper surface of the gate insulator 3 in this way.

The above-mentioned application of the semiconductor solution by inkjet is preferably performed by dropping the semiconductor solution near the center of the opening of the first partition wall part 6. This allows the semiconductor solution to spread uniformly in the area surrounded by the inner wall of the opening of the first partition wall part 6, with it being possible to form the semiconductor layer 7 with a more uniform film thickness. In this embodiment, a soluble organic semiconductor material such as pentacene, phthalocyanine, or porphyrin can be used as the semiconductor material. Moreover, the predetermined heat treatment mentioned above is preferably performed at a temperature that enables the semiconductor material included in the solution to crystallize without being thermally decomposed, and enables the solvent of the solution to evaporate. In this embodiment, the heat treatment is performed at a temperature around 200° C.

Next, as shown in (j) in FIG. 3, the insulation layer 8 is formed over the entire substrate 1, above the semiconductor layer 7. The insulation layer 8 is formed with a desired thickness so that its surface is planarized. For example, the insulation layer 8 can be formed by applying a predetermined material such as SOG and burning it.

Next, as shown in (k) in FIG. 3, the contact hole 8H is formed in the insulation layer 8 on the drain electrode 5 on the opposite side of the partition wall of the first partition wall part 6 to the semiconductor layer 7, to expose a part of the drain electrode 5. The surface of the second drain electrode 52 which is the upper layer of the drain electrode 5 is exposed as a result of forming the contact hole 8H in the insulation layer 8 in this way.

Next, as shown in (l) in FIG. 3, the lower electrode 9 is formed above the insulation layer 8 and above the drain electrode 5 exposed in the contact hole 8H. For example, the lower electrode 9 can be formed by forming a metal film by sputtering and patterning the metal film by photolithography and wet etching.

Next, as shown in (m) in FIG. 3, a photosensitive resin is patterned to form the second partition wall part 10 having a plurality of openings corresponding to the plurality of pixels in a matrix. Following this, the organic layer 11 is formed in the opening of the second partition wall part 10. For example, the organic layer 11 can be formed by spin coating a PEDOT solution to form the hole injection layer, layering α-NPD and Alq3 on the hole injection layer by vacuum evaporation to form the light emitting layer, and layering a compound such as a nitro-substituted fluorenone derivative on the light emitting layer by spin coating to form the electron transport layer. After this, the upper electrode 12 made of ITO is formed above the organic layer 11 by sputtering. The organic EL element 120 is thus produced.

Next, as shown in (n) in FIG. 3, the sealing layer 13 is applied over the upper electrode 12, and the sealing substrate 14 is placed on the sealing layer 13. The color filters (light control layer) may be formed on the sealing substrate 14 beforehand. In this case, the sealing substrate 14 is placed on the applied sealing layer 13, with its surface provided with the color filters facing the upper electrode 12.

Heat or energy beams are then applied while pressurizing the sealing substrate 14 downward from the upper surface, to cure the sealing layer 13. This enables the sealing substrate 14 and the upper electrode 12 to be bonded together. The thin film sealing layer made of silicon nitride may be formed above the upper electrode 12 by plasma CVD, before applying the sealing layer 13. The display panel device 100 according to this embodiment can be manufactured as described above.

The following describes the working effects of the display panel device 100 according to this embodiment.

In the display panel device 100 according to this embodiment, the source electrode 4 and the drain electrode 5 have the stack structure of the low density film and the high density film lower in resistance than the low density film, as mentioned above. Accordingly, the resistance of the source electrode 4 and the drain electrode 5 can be reduced as compared with the case where the source electrode 4 and the drain electrode 5 are formed as the single layer of the low density film. Hence, low-resistance wiring can be realized even when using part of the source electrode 4 and the drain electrode 5 as wiring. This prevents a decrease in display image quality. Since the high density film is lower in resistance than the low density film, the film thickness of the first source electrode 41 and the first drain electrode 51 as the high density film is preferably larger than the film thickness of the second source electrode 42 and the second drain electrode 52 as the low density film. The resistance of the source electrode 4 and the drain electrode 5 can be further reduced in this way.

Figure 4:
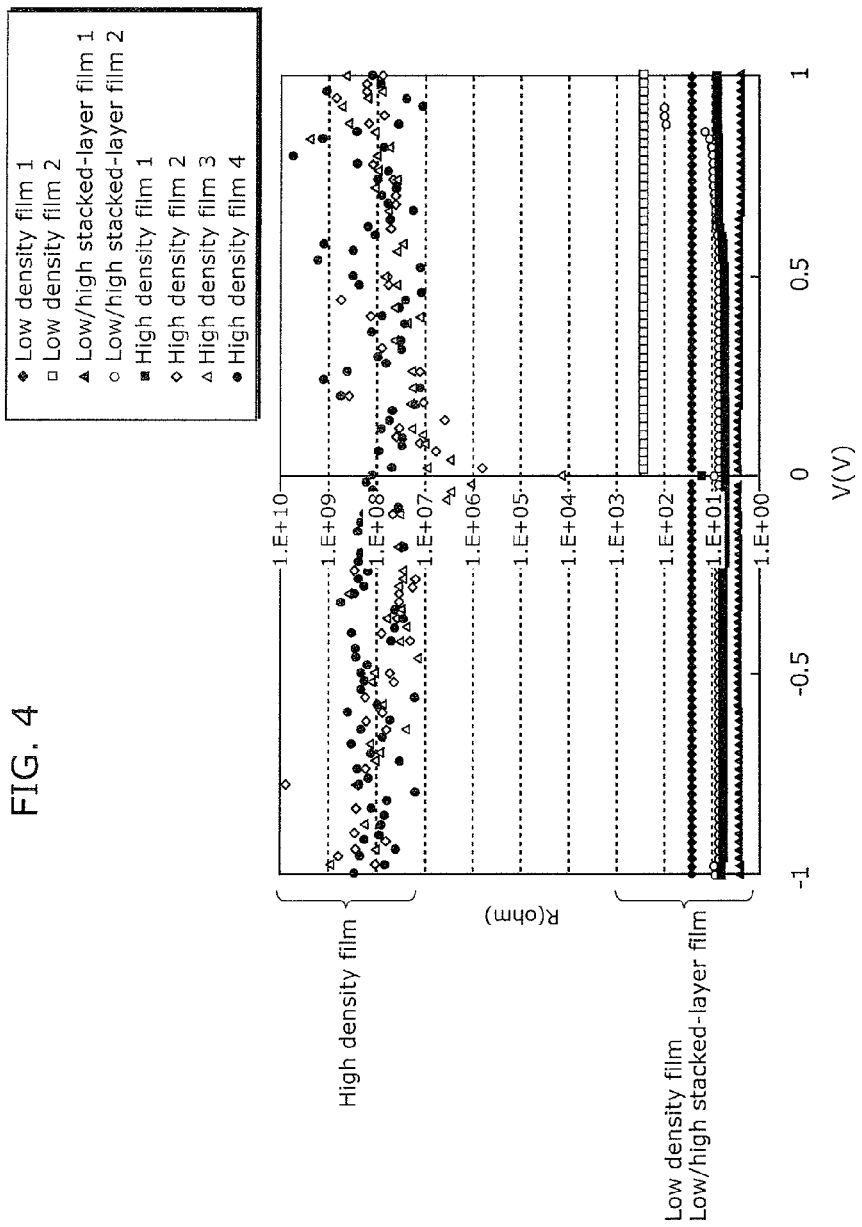
FIG. 4 is a diagram showing relationships between a Mo film formed by sputtering and a contact resistance between the Mo film and a lower electrode.

The working effects of the contact part (the contact part between the drain electrode 5 and the lower electrode 9) in the display panel device 100 according to this embodiment are described below, with reference to FIG. 4. FIG. 4 is a diagram showing the relationships between the Mo film formed by sputtering and the contact resistance between the Mo film and the lower electrode. In FIG. 4, the term "high density film" indicates the high density film composed of the Mo single layer, the term "low density film" indicates the low density film composed of the Mo single layer, and the term "low/high stacked-layer film" indicates the stacked-layer film of the Mo low density film (upper layer) and the Mo high density film (lower layer). The low density film was formed twice, the high density film was formed four times, and the low/high stacked-layer film was formed twice.

As shown in FIG. 4, the high density film varies in contact resistance, and has a yield of 25%. Meanwhile, the low density film and the low/high stacked-layer film do not vary much in contact resistance, and have a yield of 100%. Thus, by forming the Mo layer as the stacked-layer film of the low density film and the high density film, it is possible to realize a TFT electrode (the drain electrode 5) of a low resistance and a high yield.

Figure 5:
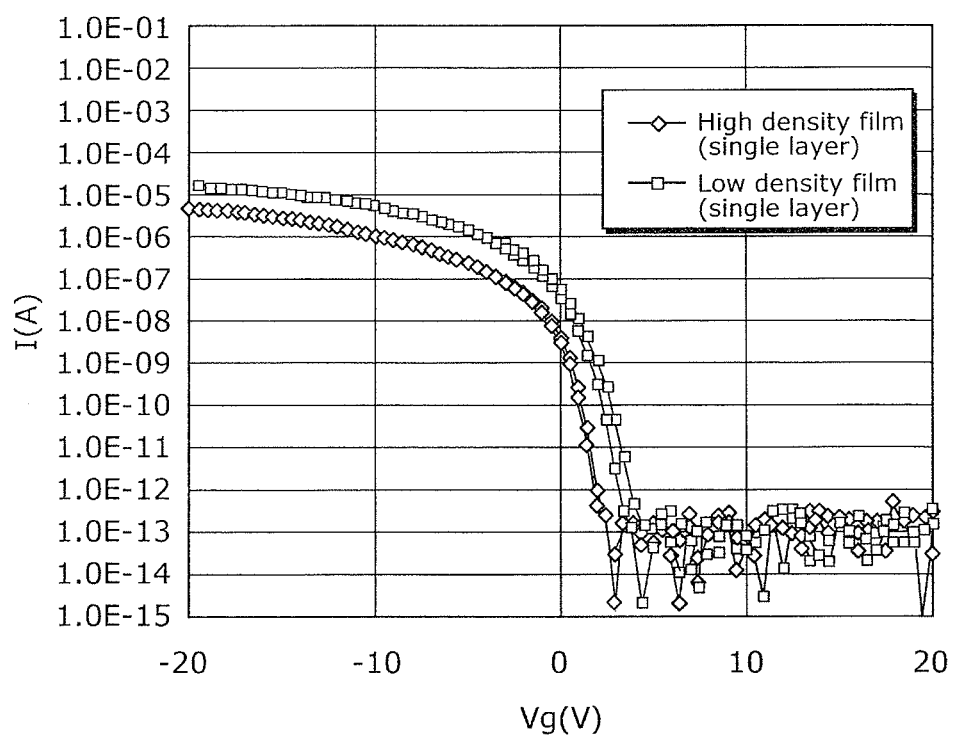
FIG. 5 is a diagram showing relationships between a film density of a source/drain electrode in a thin film transistor and current-voltage characteristics of the thin film transistor.

The working effects of the TFT part (semiconductor layer formation area) in the display panel device 100 according to this embodiment are described below, with reference to FIGS. 5 and 6. FIG. 5 is a diagram showing the relationships between the film density of the source/drain electrode in the thin film transistor and the current-voltage characteristics of the thin film transistor. In FIG. 5, the characteristics designated by "◇" indicate the current-voltage characteristics in the case where the source/drain electrode is composed of the high density film (single layer), and the characteristics designated by "□" indicate the current-voltage characteristics in the case where the source/drain electrode is composed of the low density film (single layer).

As shown in FIG. 5, the TFT including the source/drain electrode of the low density film exhibits more excellent turn-on characteristics than the TFT including the source/drain electrode of the high density film. The electrical charge mobility of the TFT including the source/drain electrode of the low density film is calculated at 0.78 $[cm^2/V \cdot s]$, and the electrical charge mobility of the TFT including the source/drain electrode of the high density film is calculated at 0.29 $[cm^2/V \cdot s]$.

These results demonstrate that, in the case where the source electrode 4 and the drain electrode 5 have a plurality of layers, more excellent electrical charge mobility can be attained when the film in the source electrode 4 and the drain electrode 5 in the contact part with the semiconductor layer 7 is the low density film rather than the high density film.

Therefore, the source electrode 4 and the drain electrode 5 in the display panel device 100 according to this embodiment are formed so that the lower layer is the high density film (the first source electrode 41, the first drain electrode 51) and the upper layer is the low density film (the second source electrode 42, the second drain electrode 52). The use of the low density film in the contact part with the semiconductor layer 7 contributes to high electrical charge mobility, with it being possible to realize a display panel device including a thin film transistor with excellent turn-on characteristics. Such a thin film transistor with excellent turn-on characteristics enables high-quality image display particularly when used as a driver transistor for driving an organic EL element in an organic EL display device.

Figure 6:
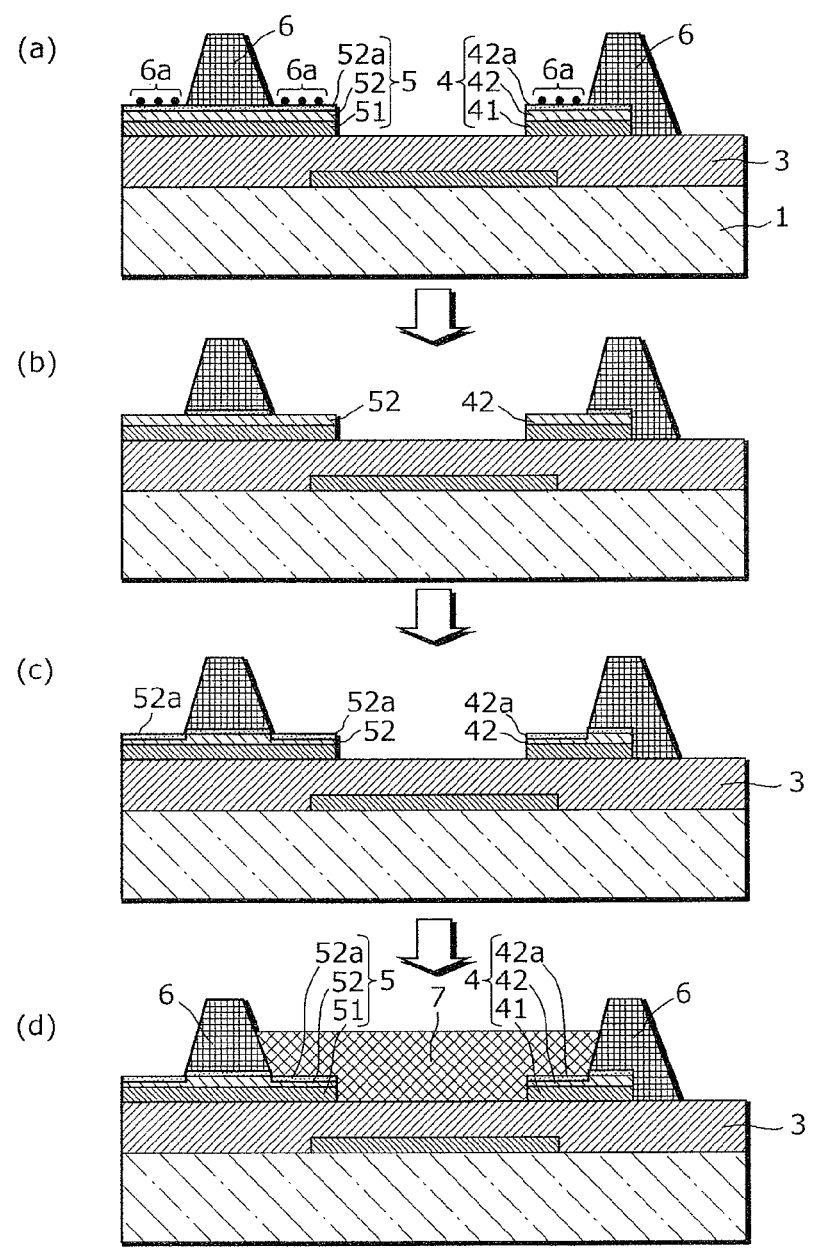
FIG. 6 is a diagram for describing part of the manufacturing process of the display panel device according to the exemplary embodiment.

The following describes a mechanism for further improving the electrical charge mobility of the thin film transistor by the structure of the display panel device 100 according to this embodiment, with reference to FIG. 6. FIG. 6 is a diagram for describing part of the manufacturing process of the display panel device according to this embodiment.

As shown in (g) and (h) in FIG. 3 described above, the first partition wall part 6 is formed by exposing and developing the partition wall layer 6R. Here, as shown in (a) in FIG. 6, a residue 6a of the partition wall layer 6R is present on the exposed surfaces of the source electrode 4 and the drain electrode 5, i.e. the surfaces of the second source electrode 42 and the second drain electrode 52 in the upper layer. The residue 6a is the residue of the partition wall layer 6R remaining after the partition wall layer 6R is developed, and is the photosensitive resin forming the partition wall layer 6R or the altered photosensitive resin. When the residue 6a remains on the surfaces of the source electrode 4 and the drain electrode 5, the crystallinity of the semiconductor layer 7 in the part contacting the source electrode 4 and the drain electrode 5 degrades, which causes degradation in TFT characteristics such as the electrical charge mobility.

In this embodiment, the source electrode 4 and the drain electrode 5 are formed by patterning the stacked-layer film of the high density metal film HM as the high density film and the low density metal film LM as the low density film, as shown in (e) and (f) in FIG. 3 described above. At this time, oxide films 42a and 52a are generated on the surface of the stacked-layer film, i.e. the surfaces of the second source electrode 42 and the second drain electrode 52 formed by the low density metal film LM as the upper layer, as shown in (a) in FIG. 6.

The low density film allows the surface oxide film to dissolve more easily than the high density film, due to its porous film structure. The oxide film of the low density film is therefore easily removable. Accordingly, in the cleaning step in the step of forming the first partition wall part 6, the oxide films 42*a* and 52*a* formed on the surfaces of the second source electrode 42 and the second drain electrode 52 as the low density film are dissolved and removed, as shown in (b) in FIG. 6.

Even when the residue 6*a* of the partition wall layer 6R remains on the surfaces of the source electrode 4 and the drain electrode 5 as shown in (a) in FIG. 6, the residue 6*a* is situated on the oxide films 42*a* and 52*a* formed on the surfaces of the second source electrode 42 and the second drain electrode 52, and so the residue 6*a* on the oxide films 42*a* and 52*a* is washed away as the oxide films 42*a* and 52*a* are dissolved in the above-mentioned cleaning step, as shown in (b) in FIG. 6. In other words, when removing the oxide films 42*a* and 52*a* which are part of the upper layer of the second source electrode 42 and the second drain electrode 52 as the low density film, the residue 6*a* of the partition wall layer 6R on the oxide films 42*a* and 52*a* of the second source electrode 42 and the second drain electrode 52 is removed, too.

Note that the film thickness of the facing ends of the second source electrode 42 and the second drain electrode 52 is reduced as a result of removing the oxide films 42*a* and 52*a* in the above-mentioned cleaning step. The cleaning step is a step performed after the development step. A desired cleaning liquid such as water, hydrofluoric acid, or oxalic acid is available as the cleaning liquid in the cleaning step.

Thus, in this embodiment, the uppermost second source electrode 42 and second drain electrode 52 function as a sacrificial layer for removing the residue 6*a* at least in the formation area of the semiconductor layer 7. The residue 6*a* is removed together with this sacrificial layer.

In this embodiment, since the residue 6*a* does not remain on the surfaces of the source electrode 4 and the drain electrode 5, the degradation of the crystallinity of the semiconductor layer 7 in the part contacting the source electrode 4 and the drain electrode 5 can be prevented. The semiconductor layer 7 with favorable crystallinity is obtained in this way. The decrease of the electrical charge mobility caused by the residue 6*a* can thus be suppressed. It is therefore possible to realize a thin film transistor with excellent turn-on characteristics.

Besides, the oxide film is more easily generated on the surface of the low density film than on the surface of the high density film, due to its film structure. Therefore, when the surfaces of the second source electrode 42 and the second drain electrode 52 as the low density film are exposed after the oxide films 42*a* and 52*a* are removed together with the residue 6*a* in the cleaning step, the surfaces of the second source electrode 42 and the second drain electrode 52 oxidize to generate the oxide films 42*a* and 52*a* (natural oxide films) again, as shown in (c) in FIG. 6. Subsequently, when the semiconductor layer 7 of the predetermined shape is formed in the opening of the first partition wall part 6 as in (i) in FIG. 3, the semiconductor layer 7 contacts the oxide films 42*a* and 52*a* formed on the surfaces of the second source electrode 42 and the second drain electrode 52, as shown in (d) in FIG. 6. That is, an oxide film composed of a $MoO_x$ film is formed at the interface between the semiconductor layer 7 and the second source electrode 42 and the second drain electrode 52 made of the Mo film.

An electrical charge moving between the source electrode 4 or the drain electrode 5 and the semiconductor layer 7 is more easily injected in an oxide metal film ($MoO_x$) than a non-oxidized metal film (Mo). In the display panel device 100 in this embodiment, the uppermost second source electrode 42 and second drain electrode 52 of the source electrode 4 and the drain electrode 5 are the low density film, so that the oxide films 42*a* and 52*a* are easily generated on the surfaces of the source electrode 4 and the drain electrode 5. This improves the electrical charge injection characteristics between the source electrode 4 or the drain electrode 5 and the semiconductor layer 7, and so improves the electrical charge mobility. It is therefore possible to realize a thin film transistor with excellent turn-on characteristics.

As described above, in the display panel device 100 according to this embodiment, the source electrode 4 and the drain electrode 5 have the stack structure of the high density film and the low density film. This reduces the resistance of the source electrode 4 and the drain electrode 5 and in particular the resistance of the wiring part, with it being possible to improve the display image quality.

Moreover, according to this embodiment, the uppermost layer (surface layer) of the source electrode 4 and the drain electrode 5 is the low density film. While this facilitates the generation of the surface oxide film, the generated surface oxide film is easily removable. Hence, the residue 6*a* remaining after the exposure and development of the first partition wall part 6 can be removed easily and, after the removal of the residue 6*a*, the oxide film can be easily generated on the source electrode 4 and the drain electrode 5 in the part contacting the semiconductor layer 7. This prevents the degradation of the crystallinity of the semiconductor layer 7, and improves the electrical charge injection characteristics. It is therefore possible to realize a thin film transistor with excellent turn-on characteristics, and so provide a display panel device capable of high quality image display.

Figure 7:
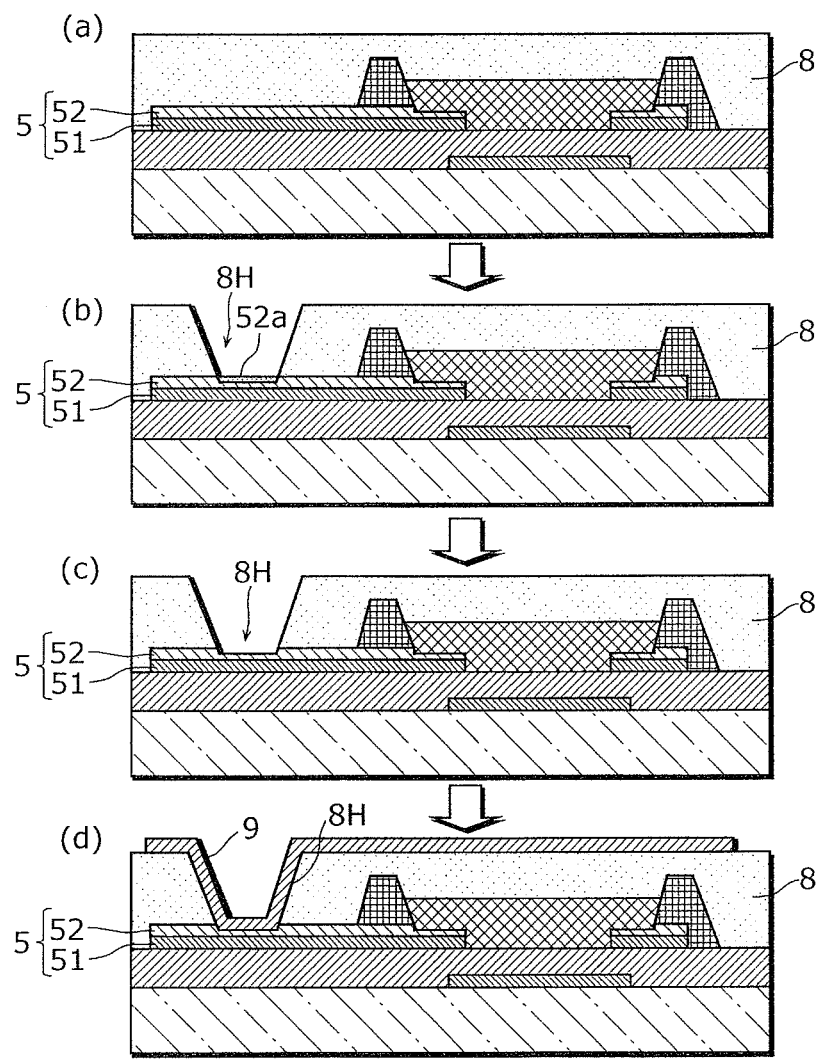
FIG. 7 is a diagram showing steps in a method of manufacturing a display panel device according to a variation of the exemplary embodiment.

In this embodiment, the contact hole 8H is formed in the insulation layer 8 and then the lower electrode 9 is formed, as shown in (k) and (l) in FIG. 3. Here, a step of removing the surface oxide film formed on the drain electrode 5 exposed in the contact hole 8H is preferably included between the step of forming the contact hole 8H and the step of forming the lower electrode 9. This step is described below, with reference to FIG. 7. FIG. 7 is a diagram showing steps in a method of manufacturing a display panel device according to a variation of this embodiment.

After the step shown in (d) in FIG. 6, the insulation layer 8 is formed by applying the insulation layer material such as SOG and burning it as in (j) in FIG. 3, as shown in (a) in FIG. 7.

Then, as shown in (b) in FIG. 7, the contact hole 8H reaching the drain electrode 5 is formed in the insulation layer 8 and burning is performed as in (k) in FIG. 3. At this time, the surface of the drain electrode 5, i.e. the exposed surface of the second drain electrode 52, is exposed to a high temperature atmosphere in the contact hole 8H, as a result of which the oxide film 52*a* is formed on the surface of the second drain electrode 52 exposed in the contact hole 8H.

Next, as shown in (c) in FIG. 7, the oxide film 52*a* formed on the surface of the drain electrode 5 exposed in the contact hole 8H is removed. Since the oxide film 52*a* is formed on the second drain electrode 52 made of the easily removable low density film, the oxide film 52*a* can be removed easily. As a result, a depression is formed in the second drain electrode 52 exposed in the contact hole 8H. The depression has a shape corresponding to the shape of the bottom of the contact hole 8H, and is formed as a result of removing the oxide film 52*a* on the surface of the second drain electrode 52. That is, the depth of the depression is substantially equal to the film thickness of the oxide film 52*a*. Note that the oxide film 52*a* in the contact hole 8H can be removed by wet etching. Water, hydrofluoric acid, oxalic acid, or the like is available as the etchant.

Next, as shown in (d) in FIG. 7, the lower electrode 9 is formed as in (l) in FIG. 3. Thus, the depression of the second drain electrode 52 and the lower electrode 9 are connected through the contact hole 8H.

As described above, in this variation, the oxide film 52a formed on the surface of the second drain electrode 52 exposed in the contact hole 8H is removed, thus reducing the contact resistance between the drain electrode 5 and the lower electrode 9. When the oxide film 52a is present in the contact hole 8H, the oxide film 52a causes the lower electrode 9 formed in the contact hole 8H to be oxidized easily. Accordingly, the oxide film 52a is removed in the above manner to suppress the oxidation of the lower electrode 9. Removing the oxide film 52a in the contact hole 8H delivers favorable contact between the drain electrode 5 and the lower electrode 9.

In this way, both the favorable crystallinity of the semiconductor layer 7 in the semiconductor area on the semiconductor layer 7 side of the partition wall of the first partition wall part 6 and the favorable contact resistance with the lower electrode 9 in the contact hole area where the contact hole 8H is formed on the other side of the partition wall of the first partition wall part 6 can be achieved by the same second drain electrode 52 on both sides.

As described above, the source electrode 4 and the drain electrode 5 are each the stacked-layer film of the low density film and the high density film. It is therefore possible to realize a display panel device including a thin film transistor that can reduce the wiring resistance of the source electrode 4 and the drain electrode 5, achieve favorable contact between the drain electrode 5 and the lower electrode 9 (pixel electrode), and exhibit excellent TFT characteristics.

Though the oxide film may already been formed on the surface of the second drain electrode 52 in (a) in FIG. 7 as shown in (d) in FIG. 6 and the like, the oxide film of the low density film is easily removable, so that the oxide film is once removed upon forming the contact hole 8H and then the oxide film 52a is formed again on the surface of the second drain electrode 52 as shown in (b) in FIG. 7.

Figure 8:
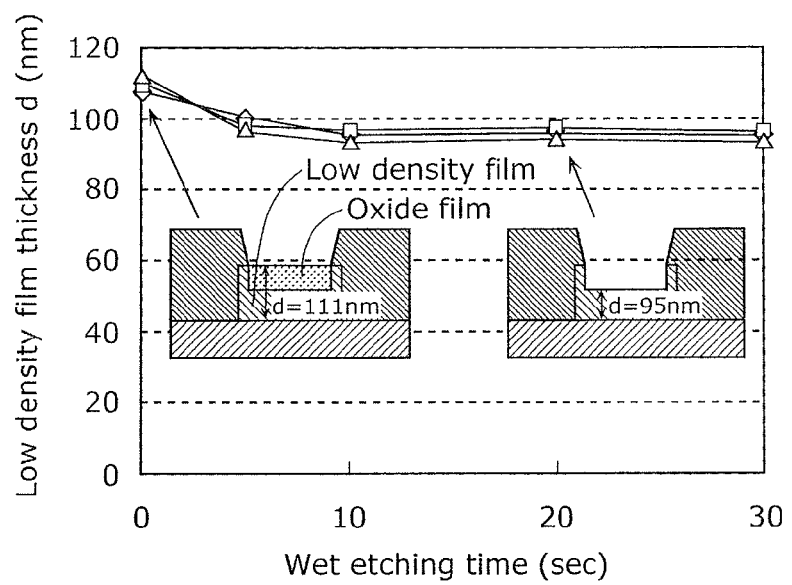
FIG. 8 is a diagram showing relationships between a film thickness of a low density film and an etching time in the case of wet etching a second source electrode and a second drain electrode (the low density film on which an oxide film is formed) according to the exemplary embodiment.

In the above embodiment and variation, the film thickness of the second source electrode 42 and the second drain electrode 52 in the source electrode 4 and the drain electrode 5 is preferably greater than or equal to 20 nm. The reason for this is described below, with reference to FIG. 8. FIG. 8 is a diagram showing the relationships between the film thickness of the low density film and the etching time in the case of wet etching the second source electrode and the second drain electrode (the low density film on which the oxide film is formed) according to this embodiment. In this experiment, the low density film of the single layer was formed using Mo. Though oxalic acid was used as the etchant, the same results are obtained using water or hydrofluoric acid.

As shown in FIG. 8, when etching the low density film (Mo single layer) with the oxide film ($MoO_x$) formed on its surface, the film thickness d changed from 111 nm before the etching to 95 nm after the etching for 10 sec or more. That is, the oxide film of Mo is about 16 nm.

In the source electrode 4 and the drain electrode 5 each of which is the stacked-layer film of the high density film and the low density film, it is preferable to oxidize only the low density film without oxidizing the high density film. This is because the surface oxide film formed on the low density film is easily removable but the surface oxide film formed on the high density film is not easily removable. In the case of removing the oxide film of the high density film, the oxide layer of the high density film is dense, and so the oxide film is hard to be removed and causes a decrease in yield. In the case of removing the oxide film of the low density film, on the other hand, the oxide layer of the low density film is porous, and so the oxide film is easily removed and a high yield is attained.

Accordingly, in the source electrode 4 and the drain electrode 5 of the stack structure in which the lower layer is the high density film and the upper layer is the low density film, the film thickness of the low density film in the upper layer needs to be at least 16 nm or more, in order not to oxidize the high density film in the lower layer. The film thickness of the low density film is preferably greater than or equal to 20 nm, when taking process margins into account. That is, the film thickness of the second source electrode 42 and the second drain electrode 52 in the source electrode 4 and the drain electrode 5 is preferably greater than or equal to 20 nm.

Figure 9:
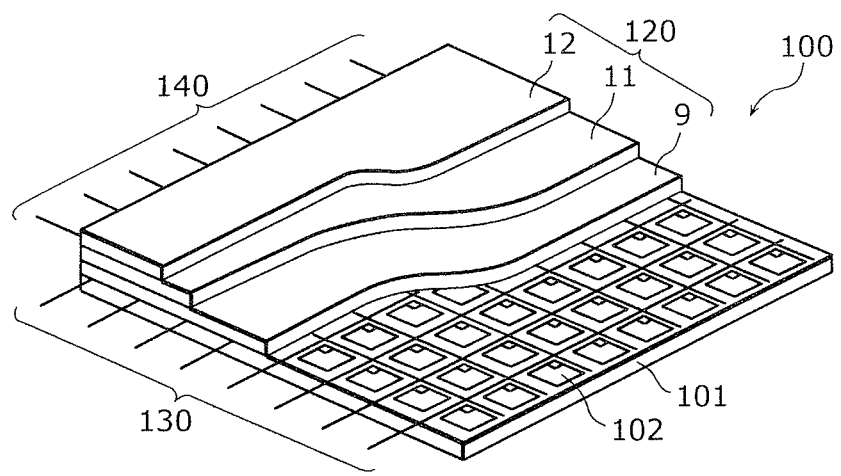
FIG. 9 is a partial cutaway perspective view showing a schematic structure of the display panel device according to the exemplary embodiment.

The following describes a schematic structure of the display panel device 100 according to this embodiment, with reference to FIG. 9. FIG. 9 is a partial cutaway perspective view showing the schematic structure of the display panel device according to this embodiment. Each structural element is schematically shown and may not be in the exact shape.

As shown in FIG. 9, the display panel device 100 according to this embodiment is an organic EL display device, and includes: an active matrix substrate (TFT array substrate) 101; organic EL elements 120 formed on the active matrix substrate 101; and a plurality of source lines 130 (video signal lines) and a plurality of gate lines 140 (scan lines) formed above the active matrix substrate 101. Each organic EL element 120 includes the lower electrode 9, the organic layer 11, and the upper electrode 12.

A plurality of pixels 102 constituting a display part are partitioned in a matrix by the intersecting source lines 130 and gate lines 140. The thin film transistor 110 is formed in each pixel 102.

Figure 10:
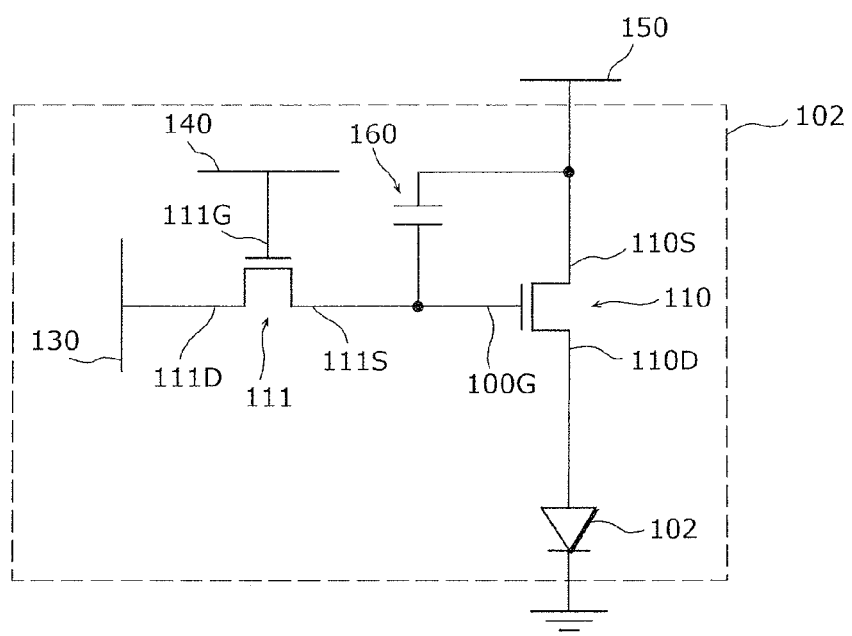
FIG. 10 is a diagram showing a circuit structure of each pixel in the display panel device according to the exemplary embodiment.

The following describes a circuit structure of each pixel 102 in the above-mentioned display panel device 100, with reference to FIG. 10. FIG. 10 is a diagram showing the circuit structure of each pixel in the display panel device according to this embodiment.

As shown in FIG. 10, the pixel 102 includes: the thin film transistor 110 which is a driver transistor for driving the organic EL element 120; a thin film transistor 111 which is a switching transistor for selecting the pixel 102; the organic EL element 120; and a capacitor 160.

The thin film transistor 110 has a source electrode 110S (the source electrode 4) connected to a power line 150, and a drain electrode 110D (the drain electrode 5) connected to the anode (lower electrode) of the organic EL element 120.

The thin film transistor 111 has a drain electrode 111D connected to the source line 130, a gate electrode 111G connected to the gate line 140, and a source electrode 111S connected to the capacitor 160 and a gate electrode 110G of the thin film transistor 110.

In this structure, when a gate signal is applied to the gate line 140 to turn on the thin film transistor 111, a video signal voltage supplied via the source line 130 is written to the capacitor 160. The holding voltage written to the capacitor 160 is held during one frame period. This holding voltage changes the conductance of the thin film transistor 110 analogously. This causes a drive current corresponding to a light emission gradation to flow from the anode to the cathode of the organic EL element 120. Thus, the predetermined organic EL element 120 in each pixel emits light, as a result of which a predetermined image is displayed on the display part.

The display panel device having such a structure can be used as a flat panel display, and is applicable to all electronic appliances including display panel devices such as television sets, personal computers, and mobile phones.

Though the display panel device and its manufacturing method according to the present disclosure have been described above by way of the embodiment, the present disclosure is not limited to the above embodiment.

For example, in the above embodiment, the source electrode 4 and the drain electrode 5 may be replaced with each other.

Though the source electrode 4 and the drain electrode 5 have the two-layer structure in the above embodiment, the present disclosure is not limited to this. For example, the source electrode 4 and the drain electrode 5 may have a multilayer structure of three or more layers, or a structure in which the film density changes gradually from high density to low density. In this case, at least the uppermost layer is preferably the same low density film as the second source electrode 42 and the second drain electrode 52.

Though the display panel device using the organic EL element (organic EL display device) is described in the above embodiment, the present disclosure is not limited to this. For example, a display panel device including a liquid crystal display element may be used. In this case, a liquid crystal display device can be realized by using the lower electrode 9 shown in FIG. 1 as a pixel electrode and providing a facing electrode above the pixel electrode via a liquid crystal layer. Display panel devices including other display elements are also applicable.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The display panel device according to one or more exemplary embodiments disclosed herein is widely applicable to display devices of television sets, personal computers, mobile phones, and other various electrical appliances.

The invention claimed is:

1. A display panel device comprising:
a substrate;
a gate electrode above the substrate;
a gate insulator above the gate electrode;
a first source electrode above the gate insulator;
a second source electrode above the first source electrode;
a first drain electrode above the gate insulator;
a second drain electrode above the first drain electrode;
a partition wall part having an opening in which at least a part of the second source electrode and a part of the second drain electrode are exposed;
a semiconductor layer in the opening;
an insulation layer above the semiconductor layer;
a pixel electrode above the insulation layer; and
a contact hole in the insulation layer, for connecting the pixel electrode and the second drain electrode or the second source electrode,
wherein a film structure of the second source electrode is sparser than a film structure of the first source electrode,
a film structure of the second drain electrode is sparser than a film structure of the first drain electrode,
in the opening, the second source electrode contacts the semiconductor layer via an oxide film of a material of the second source electrode, and the second drain electrode contacts the semiconductor layer via an oxide film of a material of the second drain electrode, and in the contact hole, the second drain electrode or the second source electrode contacts the pixel electrode without the oxide film of the material of the second drain electrode or the second source electrode.

2. The display panel device according to claim 1,
wherein sheet resistances of the first source electrode and the first drain electrode are lower than sheet resistances of the second source electrode and the second drain electrode.

3. The display panel device according to claim 2,
wherein the sheet resistances of the first source electrode and the first drain electrode are 0.5Ω/□ to 5Ω/□, and the sheet resistances of the second source electrode and the second drain electrode are 80Ω/□ to 140Ω/□.

4. The display panel device according to claim 1,
wherein the second drain electrode has a film thickness that is smaller in a part contacting the semiconductor layer than in a part not contacting the semiconductor layer, and has a depression in a part corresponding to the contact hole.

5. The display panel device according to claim 1,
wherein a film thickness of each one of the second source electrode and the second drain electrode is greater than or equal to 20 nm.

6. A method of manufacturing a display panel device, comprising:
forming a gate electrode above a substrate;
forming a gate insulator above the gate electrode;
forming a first metal film above the gate insulator;
forming a second metal film above the first metal film, the second metal film having a film structure that is sparser than a film structure of the first metal film;
forming each of a source electrode and a drain electrode by patterning the first metal film and the second metal film;
forming a partition wall layer above the source electrode and the drain electrode;
forming a partition wall by patterning the partition wall layer to form an opening in which the gate insulator between the source electrode and the drain electrode, a part of the source electrode, and a part of the drain electrode are exposed;
forming a semiconductor layer in the opening;
forming an insulation layer above the semiconductor layer;
forming a contact hole in the insulation layer above the drain electrode on an opposite side of the partition wall to the semiconductor layer, to expose the drain electrode; and
forming a pixel electrode above the insulation layer and above the drain electrode exposed in the contact hole,
wherein the forming of a semiconductor layer includes forming an oxide film of the second metal film on each of the source electrode and the drain electrode and then forming the semiconductor layer on the oxide film, and
the forming of a pixel electrode includes forming the pixel electrode on the drain electrode without the oxide film of the second metal film.

7. The method of manufacturing a display panel device according to claim 6,
wherein the forming of a partition wall includes, when forming the opening in the partition wall layer, removing a part of an upper layer of the second metal film and simultaneously removing a residue of the partition wall layer on the second metal film.

8. The method of manufacturing a display panel device according to claim 7,
wherein the forming of a partition wall includes, after removing the part of the upper layer of the second metal film, forming the oxide film of the second metal film on the second metal film.

9. The method of manufacturing a display panel device according to claim 6, comprising
   removing a surface oxide film formed on the drain electrode exposed in the contact hole, between the forming of a contact hole and the forming of a pixel electrode.

10. The method of manufacturing a display panel device according to claim 9,
   wherein the removing includes forming a depression in the second metal film in the drain electrode exposed in the contact hole.

* * * * *